United States Patent
Hsieh et al.

(10) Patent No.: US 10,826,323 B2
(45) Date of Patent: Nov. 3, 2020

(54) UN-INTERRUPTIBLE POWER SUPPLY WITH VOLTAGE-BALANCING STATE DETECTION OF BATTERIES

(71) Applicant: CYBER POWER SYSTEMS INC., Taipei (TW)

(72) Inventors: Hung-Ming Hsieh, Taipei (TW); Yung-Hao Peng, Taipei (TW); Ta-Peng Chen, Taipei (TW)

(73) Assignee: CYBER POWER SYSTEMS INC., Taipei (TW)

( * ) Notice: Subject to any disclaimer, the term of this patent is extended or adjusted under 35 U.S.C. 154(b) by 781 days.

(21) Appl. No.: 15/449,622

(22) Filed: Mar. 3, 2017

(65) Prior Publication Data

US 2018/0191175 A1     Jul. 5, 2018

(30) Foreign Application Priority Data

Jan. 3, 2017    (CN) .......................... 2017 1 0001626

(51) Int. Cl.
  *H02J 9/06*     (2006.01)
  *H02J 7/00*     (2006.01)
  *G01R 31/36*    (2020.01)

(52) U.S. Cl.
  CPC ............. *H02J 9/062* (2013.01); *G01R 31/36* (2013.01); *H02J 7/0016* (2013.01); *H02J 7/0048* (2020.01)

(58) Field of Classification Search
  CPC ................................ H02J 9/062; H02J 7/0016
  See application file for complete search history.

(56) References Cited

U.S. PATENT DOCUMENTS

| | | | |
|---|---|---|---|
| 6,201,371 B1 * | 3/2001 | Kawabe | H02J 9/062 307/66 |
| 8,917,061 B2 | 12/2014 | Zhu | |

(Continued)

FOREIGN PATENT DOCUMENTS

| | | |
|---|---|---|
| CN | 102709964 A | 10/2012 |
| CN | 103109577 A | 5/2013 |

(Continued)

OTHER PUBLICATIONS

English Abstract of CN103109577, Total of 1 page.

(Continued)

*Primary Examiner* — Richard Isla
*Assistant Examiner* — Johali A Torres Ruiz
(74) *Attorney, Agent, or Firm* — Tracy Heims; Apex Juris, PLLC.

(57) ABSTRACT

A UPS with voltage-balancing state detection of batteries includes a processor, a voltage measurement module, a voltage control module, a battery pack and a display unit. Each of the voltage measurement module and the voltage control module is connected to the processor and the battery pack. The processor is connected to the display unit, generates a voltage index value according to voltage values measured by the voltage measurement module and a voltage-balancing state according to the voltage index value and a set of index ranges, controls charging to the battery pack according to the voltage values through the voltage control module, acquires an updated voltage-balancing state of the battery pack, and instructs the display unit to display the voltage-balancing state to prompt users for battery replacement when the voltage-balancing state and the updated voltage-balancing state acquired within a state-holding time are identical.

22 Claims, 7 Drawing Sheets

(56) References Cited

U.S. PATENT DOCUMENTS

| | | | | |
|---|---|---|---|---|
| 2007/0228835 A1* | 10/2007 | Varzhabedian | ......... | H02J 7/027 307/66 |
| 2008/0090133 A1* | 4/2008 | Lim | ..................... | H02J 7/0016 429/50 |
| 2015/0311750 A1* | 10/2015 | Hui Jung | ................ | H02J 9/061 307/66 |
| 2017/0070074 A1* | 3/2017 | Sugeno | ................... | H02J 9/062 |
| 2017/0205861 A1* | 7/2017 | Matsuda | ................... | H02J 3/32 |
| 2018/0079317 A1* | 3/2018 | Yoshida | ................ | B60L 3/0046 |

FOREIGN PATENT DOCUMENTS

| | | |
|---|---|---|
| CN | 203014423 U | 6/2013 |
| CN | 202395480 U | 12/2013 |
| CN | 103683359 A | 3/2014 |
| CN | 102742112 B | 12/2015 |
| CN | 105449734 A | 3/2016 |
| CN | 106154900 A | 11/2016 |
| EP | 1265336 A2 | 12/2002 |
| WO | 2013181121 A1 | 12/2013 |

OTHER PUBLICATIONS

English Abstract of CN202395480, Total of 1 page.
English Abstracts for CN 203014423U, CN102709964A, CN105449734A, CN103683359A, CN102742112B, CN106154900A, Total of 3 pages.

\* cited by examiner

UN-INTERRUPTIBLE POWER SUPPLY WITH VOLTAGE-BALANCING STATE DETECTION OF BATTERIES

BACKGROUND OF THE INVENTION

1. Field of the Invention

The present invention relates to a un-interruptible power supply (UPS) and, more particularly, to a UPS with voltage-balancing state detection of batteries.

2. Description of the Related Art

To prevent loss arising from unexpected shutdown of computers and servers during mains power failure, conventionally, UPSs are provided to supply short-term power to computers and servers for storing data generated in operation and avoiding any form of loss out of missing information during mains power failure. Hence, operational reliability of batteries used by UPSs becomes critical point concerned.

As disclosed in Chinese Patent Publication No. 103109577 (hereinafter D1), a method for balanced display of electric quantity of a lead-acid storage battery based on the grey statistic theory includes the following steps: continuously sampling all single discharge end voltages Ui (0) (k), all single discharge currents Ii (0) (k) and all single temperatures Ti (0) (k) of the lead-acid storage battery pack at a fixed period when in discharge; calculating a sequence U'i (0) (k) after the polarities of all single discharge end voltages Ui (0) (k) of the lead-acid storage battery pack are unified, a sequence I'i (0) (k) after the polarities of all the single discharge currents Ii (0) (k) of the lead-acid storage battery pack are unified and a sequence T'i (0) (k) after the polarities of all the single temperatures Ti (0) (k) of the lead-acid storage battery pack are unified, wherein the sequence U'i (0) (k), the sequence I'i (0) (k) and the sequence T'i (0) (k) belong to gray weights with various energy-level states namely, fullness of electric quantity (1), high electric quantity (2), medium electric quantity (3), low electric quantity (4) and lacking of electric quantity (5); and constructing an energy level sample matrix according to the five energy-level states. In the method, the reliability and the stability are achieved, and the accuracy of electric quantity display is improved.

Although calculating the discharge voltage, discharge current and temperature of the lead-acid storage battery pack, D1 only provides display of accurate energy-level state without knowing state of health of the lead-acid storage battery pack.

As disclosed in Chinese Patent Publication No. 202395480 (hereinafter D2), a lithium battery protection plate with a balance display function is characterized in that an LED (light emitting diode) display lamp, an LED, a detection resistor and a circuit board of the lithium battery protection plate sequentially form a circuit loop. Given the lithium battery protection plate with the balance display function, an installer can directly know whether the current balance function is normal according to the on/off display of the balance LED, thereby greatly improving the balance detection efficiency and the assembly success rate of a battery pack.

Although the installer can be aware of whether the balance function is normal according to the on/off display of the balance LED, the state of health of the lithium battery is unknown. In other words, users are not aware of whether the operational performance of the lithium battery is normal.

As disclosed in PCT Publication No. WO2013181121 (hereinafter D3), a method of equalization of a string of batteries includes charging at least one string of battery modules until a first single module reaches a preset maximum voltage; reducing or pulsing a charge current to the at least one string; and repeating the charging step. The at least one string of battery modules includes at least two series connected modules that display concave-down and increasing-shaped charge or voltage profiles.

Despite the display of the concave down and increasing-shaped charge or voltage profiles through varying charging state, display of state of health of the battery modules is not available. Therefore, users are not aware of when the battery modules should be replaced.

SUMMARY OF THE INVENTION

An objective of the present invention is to provide a UPS with voltage-balancing state detection of batteries, which shows a voltage-balancing state of batteries through a display, controls charging to the batteries to restore the batteries to a healthy voltage-balancing state, and prompts users for battery replacement when the batteries fail to restore to the healthy voltage-balancing state.

To achieve the foregoing objective, the un-interruptible power supply with voltage-balancing state detection of batteries includes an AC power input port, a battery charging unit, a DC to AC converter, a two-way switch, an AC power output port, a first processor, a display unit, a battery pack, a voltage measurement module and a voltage control module.

The AC power input port is adapted to receive mains power.

The battery charging unit is connected to the AC power input port.

The DC to AC converter is connected to the battery charging unit.

The two-way switch has a first active terminal, a second active terminal and a common terminal. The first active terminal is connected to the AC power input port. The second active terminal is connected to the DC to AC converter. The two-way switch receives a control signal to control the common terminal to switch to connect to one of the first active terminal and the second active terminal.

The AC power output port is connected to the common terminal of the two-way switch and is adapted to be connected to an external electronic device to supply an AC power to the external electronic device.

The first processor is connected to the AC power input port to receive an AC power sensing signal, is connected to the two-way switch to send the control signal to the two-way switch to switch the common terminal to connect to one of the first active terminal and the second active terminal, and has a signal conversion unit converting received voltage signals into voltage values.

The display unit is connected to the first processor to display information outputted from the first processor.

The battery pack is connected to the battery charging unit and the DC to AC converter, supplies a DC power, and is charged by power transmitted from the battery charging unit.

The voltage measurement module is connected to the first processor and the battery pack, measures voltage signals of the battery pack, and sends the measured voltage signals of the battery pack to the first processor.

The voltage control module is connected to the first processor, the battery pack and the voltage measurement module.

The first processor generates a voltage index value according to the voltage values converted from the voltage signals transmitted from the voltage measurement module, generates battery state information according to the voltage index value and a set of index ranges, controls the voltage control module to charge the battery pack according to the measured voltages, acquires updated battery state information again, and instructs the display unit to display the battery state information of the battery pack when the battery state information and the updated battery state information acquired within a preset state-holding time are identical.

Given the foregoing UPS, the first processor generates a voltage index value according to voltage values measured by the voltage measurement module and a voltage-balancing state according to the voltage index value and a set of index ranges, controls charging to the battery pack according to the voltage values through the voltage control module, acquires an updated voltage-balancing state of the battery pack, and instructs the display unit to display the voltage-balancing state to prompt users when the voltage-balancing state and the updated voltage-balancing state acquired within a state-holding time are identical. Accordingly, users can be aware of whether the battery pack is healthy or not and replace the battery pack when the battery pack is not healthy any more.

Other objectives, advantages and novel features of the invention will become more apparent from the following detailed description when taken in conjunction with the accompanying drawings.

DETAILED DESCRIPTION OF THE INVENTION

Figure 1:
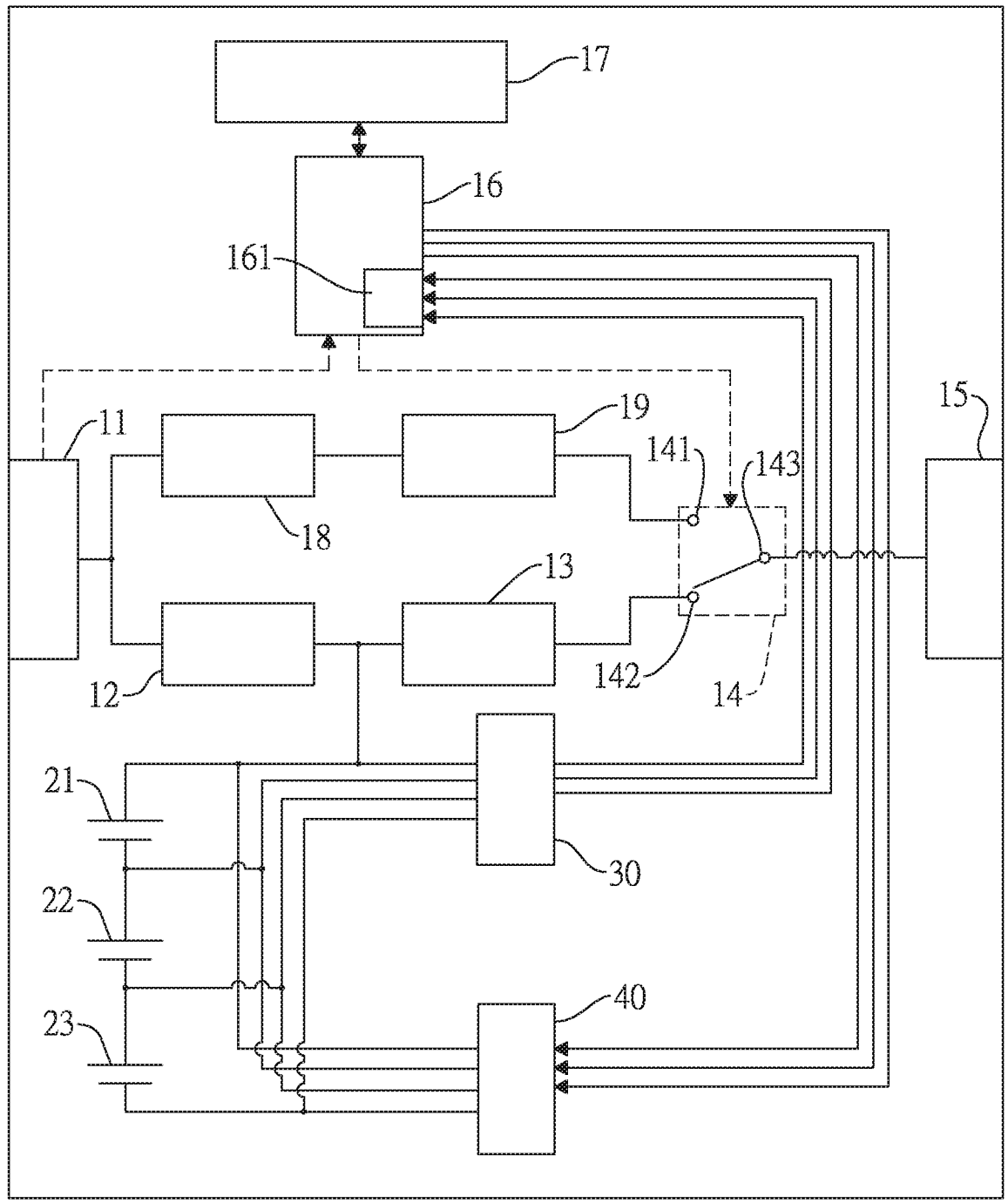
FIG. 1 is a functional block diagram of a first embodiment of a UPS in accordance with the present invention.

With reference to FIG. 1, a first embodiment of an un-interruptible power supply (UPS) with voltage-balancing state detection of batteries in accordance with the present invention includes an AC (Alternating Current) power input port 11, a battery charging unit 12, a DC (Direct Current) to AC converter 13, a two-way switch 14, an AC power output port 15, a first processor 16, a display unit 17, a battery pack, a voltage measurement module 30 and a voltage control module 40. In the present embodiment, the UPS further includes a surge protector 18 and a filter 19.

The battery charging unit 12 has an input terminal connected to the AC power input port 11 and an output terminal connected to an input terminal of the DC to AC converter 13 and the battery pack. The battery charging unit 12 receives an AC power from the AC power input port 11 and converts the AC power into a DC power to charge the battery pack.

The surge protector 18 has an input terminal connected to the AC power input port 11 and an output terminal connected to an input terminal of the filter 19, and provides surge protection for the AC power. The filter 19 filters noises in the AC power.

The two-way switch 14 has a first active terminal 141, a second active terminal 142 and a common terminal 143. The first active terminal 141 is connected to an output terminal of the filter 19. The second active terminal 142 is connected to an output terminal of the DC to AC converter 13. The common terminal 143 is connected to the AC power output port 15.

The first processor 16 is connected to the two-way switch 14, the display unit 17, the AC power input port 11, the voltage measurement module 30 and the voltage control module 40, and has a first signal conversion unit 161 converting analog signals received from the voltage measurement module 30 into digital values.

The battery pack has a first battery 21, a second battery 22 and a third battery 23 sequentially connected in series. A positive terminal of the first battery 21 is connected to the input terminal of the DC to AC converter 13. In the present embodiment, the first battery 21, the second battery 22 and the third battery 23 are identical batteries with a same rated voltage. The rated voltage is defined as and is equal to a rated voltage reference value. The number of each of the first battery 21, the second battery 22 and the third battery 23 given here is based on actual demand and is taken for exemplification and not for limitation.

The AC power input port 11 is connected to mains power. When receiving an AC power sensing signal from the AC power input port 11, the first processor 16 controls the two-way switch 14 to switch the common terminal 143 to connect to the first active terminal 141 for the mains power to directly supply power to an external electronic device in connection with the AC power output port 15. When receiving no AC power sensing signal, the first processor 16 controls the two-way switch 14 to switch the common terminal 143 to connect to the second active terminal 142 to output power of the battery pack to the AC power output port 15 through the DC to AC converter 13 for supplying power to the external electronic device.

Figure 2:
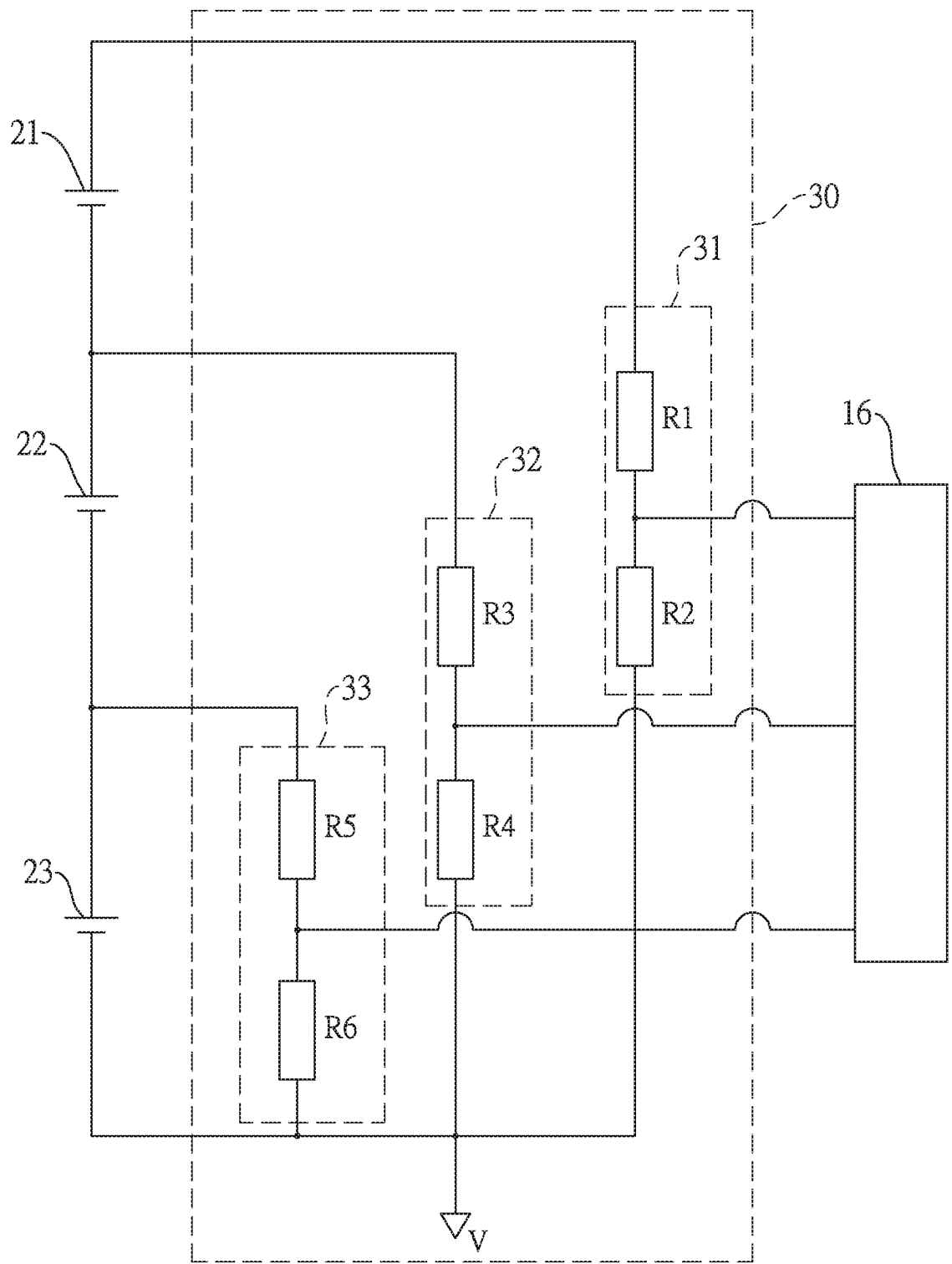
FIG. 2 is a functional block diagram of a voltage measurement module of the UPSs in FIGS. 1 and 7.

With reference to FIGS. 1 and 2, the voltage measurement module 30 includes a first measurement circuit 31, a second measurement circuit 32 and a third measurement circuit 33.

The first measurement circuit 31 has a first resistor R1 and a second resistor R2. One end of the first resistor R1 is connected to the positive terminal of the first battery 21 and the input terminal of the DC to AC converter 13. One end of the second resistor R2 is connected to the other end of the first resistor R1 and the first processor 16.

The second measurement circuit 32 has a third resistor R3 and a fourth resistor R4. One end of the third resistor R3 is connected to a positive terminal of the second battery 22. One end of the fourth resistor R4 is connected to the other end of the third resistor R3 and the first processor 16.

The third measurement circuit 33 has a fifth resistor R5 and a sixth resistor R6. One end of the fifth resistor R5 is connected to a positive terminal of the third battery 23. One end of the sixth resistor R6 is connected to the other end of the fifth resistor R5 and the first processor 16. The other ends of the second resistor R2, the fourth resistor R4 and the sixth resistor R6 are commonly connected to a negative terminal of the third battery 23.

The first measurement circuit 31 acquires voltages of the first battery 21, the second battery 22 and the third battery 23 and transmits a total voltage taken as a sum of the voltages of the first battery 21, the second battery 22 and the third battery 23 to the first processor 16. The second measurement circuit 32 acquires voltages of the second battery 22 and the third battery 23 and transmits a total voltage taken as a sum of the voltages of the second battery 22 and the third battery 23 to the first processor 16. The third measurement circuit 33 acquires voltage of the third battery 23 and transmits the voltage to the first processor 16. The first signal conversion unit 161 of the first processor 16 converts the total voltages transmitted from the first and second measurement circuits 31, 32 and the voltage transmitted from the third measurement circuit 33 in the form of analog signals into corresponding digital voltage values. The first processor 16 converts the voltage of the third battery 23 into a third voltage value. The first processor 16 converts the total voltage transmitted from the second measurement circuit 32 into a first temporary voltage value, and the third voltage value is subtracted from the first temporary voltage value to generate a second voltage value corresponding to the second battery 22. The first processor 16 converts the total voltage transmitted from the first measurement circuit 31 into a second temporary voltage value, and the second voltage value and the third voltage value are subtracted from the second temporary voltage value to generate a first voltage value corresponding to the first battery 21. The first processor 16 performs processing according to the first voltage value, the second voltage value and the third voltage value.

Figure 3:
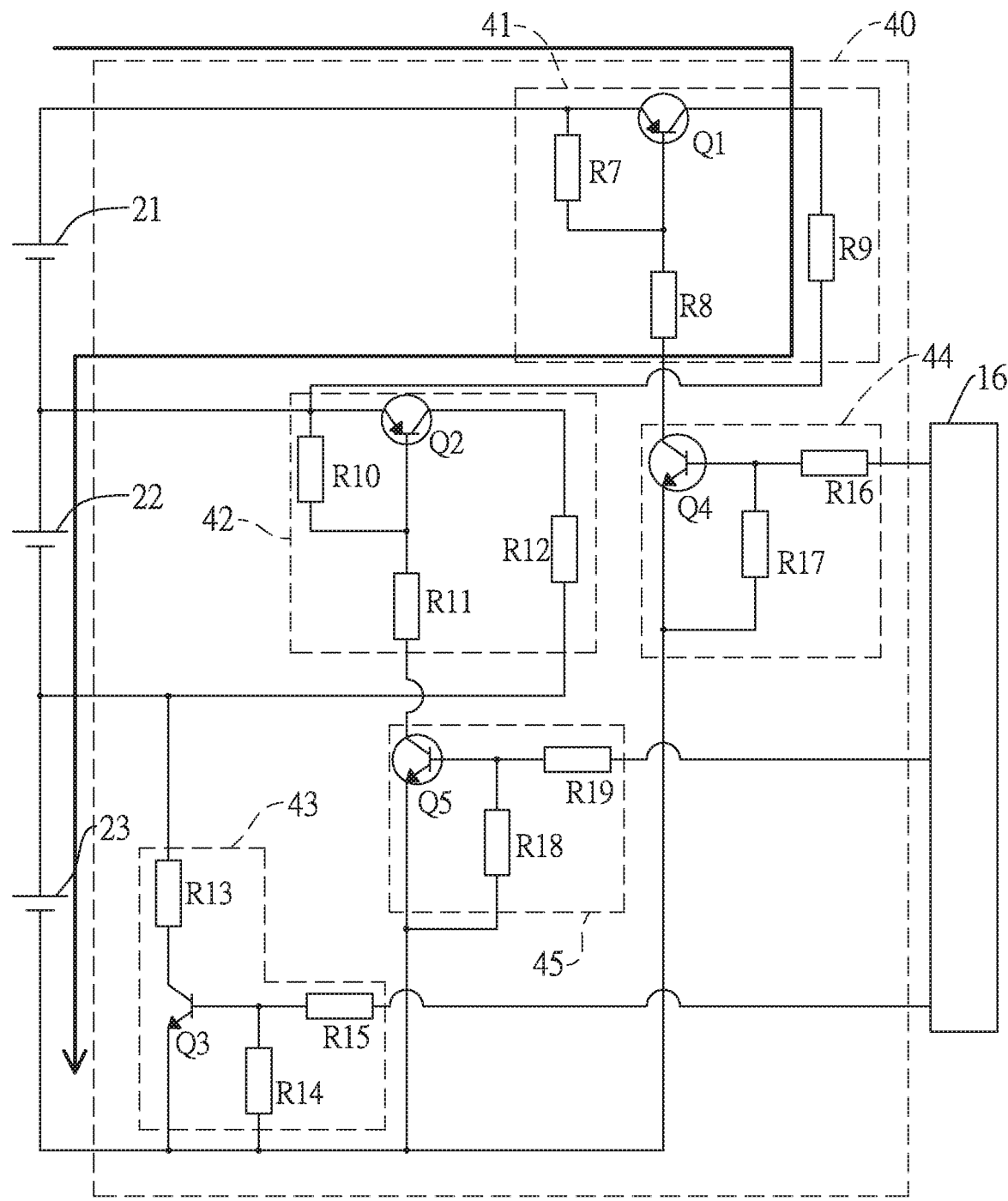
FIG. 3 is a circuit diagram of a voltage control module in the UPSs in FIGS. 1 and 7 showing a first current flowing path under operation.

With reference to FIGS. 1 and 3, the voltage control module 40 includes a first transistor switching unit 41, a second transistor switching unit 42, a third transistor switching unit 43, a first signal switching unit 44 and a second signal switching unit 45.

The first transistor switching unit 41 has a first transistor Q1, a seventh resistor R7, an eighth resistor R8 and a ninth resistor R9. A first terminal (emitter) of the first transistor Q1 is connected to one end of the seventh resistor R7 and the positive terminal of the first battery 21. A second terminal (base) of the first transistor Q1 is connected to the other end of the seventh resistor R7 and one end of the eighth resistor R8. A third terminal (collector) of the first transistor Q1 is connected to one end of the ninth resistor R9.

The second transistor switching unit 42 has a second transistor Q2, a tenth resistor R10, an eleventh resistor R11 and a twelfth resistor R12. A first terminal (emitter) of the second transistor Q2 is connected to one end of the tenth resistor R10, the positive terminal of the second battery 22 and the other end of the ninth resistor R9 of the first transistor switching unit 41. A second terminal (base) of the second transistor Q2 is connected to the other end of the tenth resistor R10 and one end of the eleventh resistor R11. A third terminal (collector) of the second transistor Q2 is connected to one end of the twelfth resistor R12.

The third transistor switching unit 43 has a third transistor Q3, a thirteenth resistor R13, a fourteenth resistor R14 and a fifteenth resistor R15. A first terminal (emitter) of the third transistor Q3 is connected to the negative terminal of the third battery 23 and one end of the fourteenth resistor R14. A second terminal (base) of the third transistor Q3 is connected to the other end of the fourteenth resistor R14 and one end of the fifteenth resistor R15. A third terminal (collector) of the third transistor Q3 is connected to one end of the thirteenth resistor R13, and the other end of the thirteenth resistor R13 is connected to the other end of the twelfth resistor R12 and the positive terminal of the third battery 23.

The first signal switching unit 44 includes a fourth transistor Q4, a sixteenth resistor R16 and a seventeenth resistor R17. A first terminal (emitter) of the fourth transistor Q4 is connected to one end of the seventeenth resistor R17, the negative terminal of the third battery 23 and the first terminal (emitter) of the third transistor Q3. A second terminal (base) of the fourth transistor Q4 is connected to one end of the sixteenth resistor R16 and the other end of the seventeenth resistor R17. A third terminal (collector) of the fourth transistor Q4 is connected to the other end of the eighth resistor R8. The other end of the sixteenth resistor R16 is connected to the first processor 16.

The second signal switching unit 45 includes a fifth transistor Q5, an eighteenth resistor R18 and a nineteenth resistor R19. A first terminal (emitter) of the fifth transistor Q5 is connected to one end of the eighteenth resistor R18, the negative terminal of the third battery 23 and the first terminal (emitter) of the third transistor Q3. A second terminal (base) of the fifth transistor Q5 is connected to the other end of the eighteenth resistor R18 and one end of the nineteenth resistor R19. A third terminal (collector) of the fifth transistor Q5 is connected to the other end of the eleventh resistor R11. The other end of the nineteenth resistor R19 is connected to the first processor 16.

With reference to FIG. 3, when adjusting charging to the first battery 21 to balance voltages of the first battery 21, the second battery 22 and the third battery 23, the first processor 16 sends a corresponding control signal to turn on the fourth transistor Q4 of the first signal switching unit 44 and turn on the first transistor Q1 of the first transistor switching unit 41 for a minor part of current to flow to the first battery 21 and for a major part of current to flow to the second battery 22 and the third battery 23 through the first transistor Q1 and the ninth resistor R9 for charging.

Figure 4:
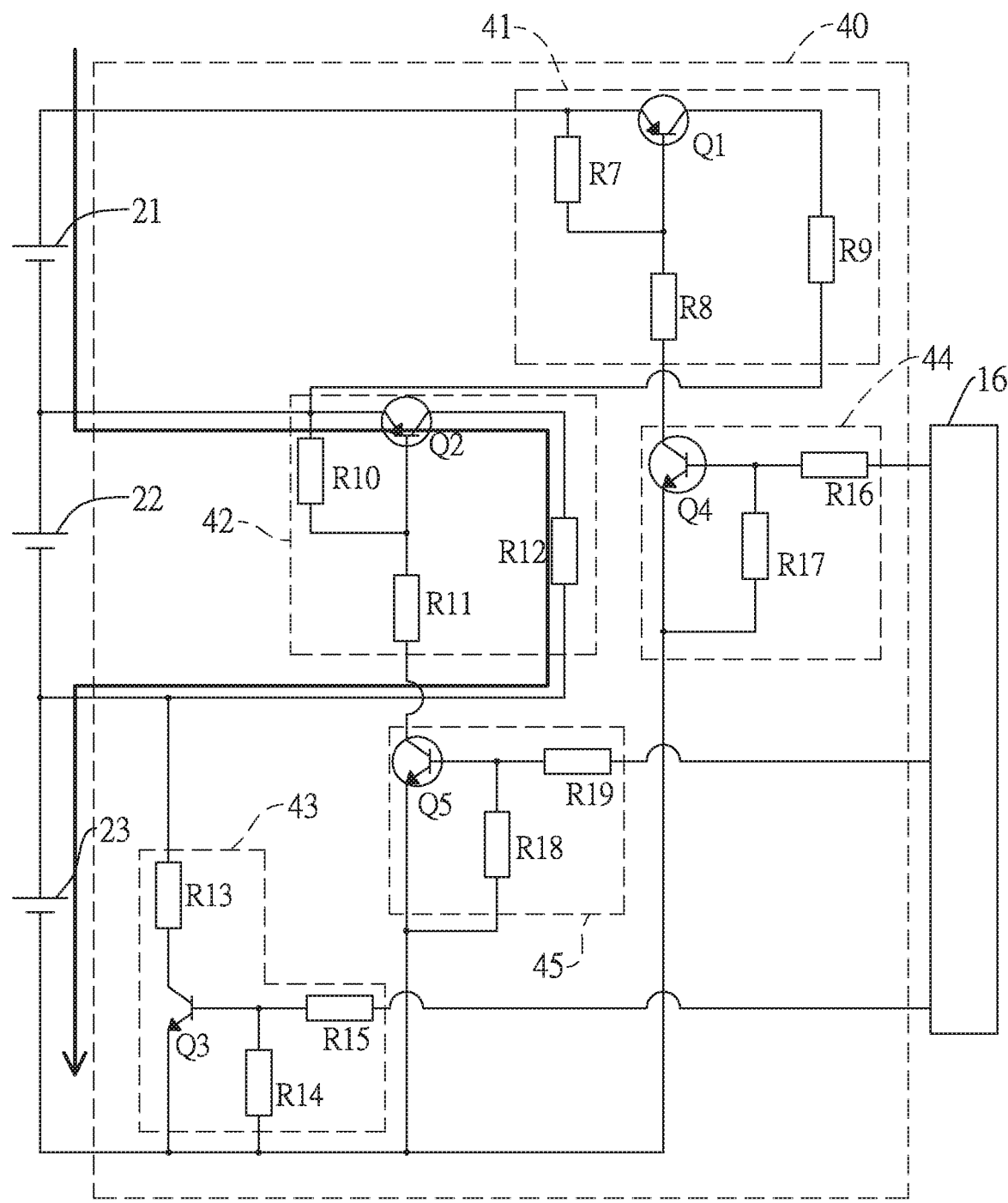
FIG. 4 is a circuit diagram of a voltage control module in the UPSs in FIGS. 1 and 7 showing a second current flowing path under operation.

With reference to FIG. 4, when adjusting charging to the second battery 22 to balance voltages of the first battery 21, the second battery 22 and the third battery 23, the first processor 16 sends a corresponding control signal to turn on the fifth transistor Q5 of the second signal switching unit 45 and turn on the second transistor Q2 of the second transistor switching unit 42, such that after current flows through and charges the first battery 21, a minor part of the current charges the second battery 22 and a major part of the current charges the third battery 23 through the second transistor Q2 and the twelfth resistor R12.

Figure 5:
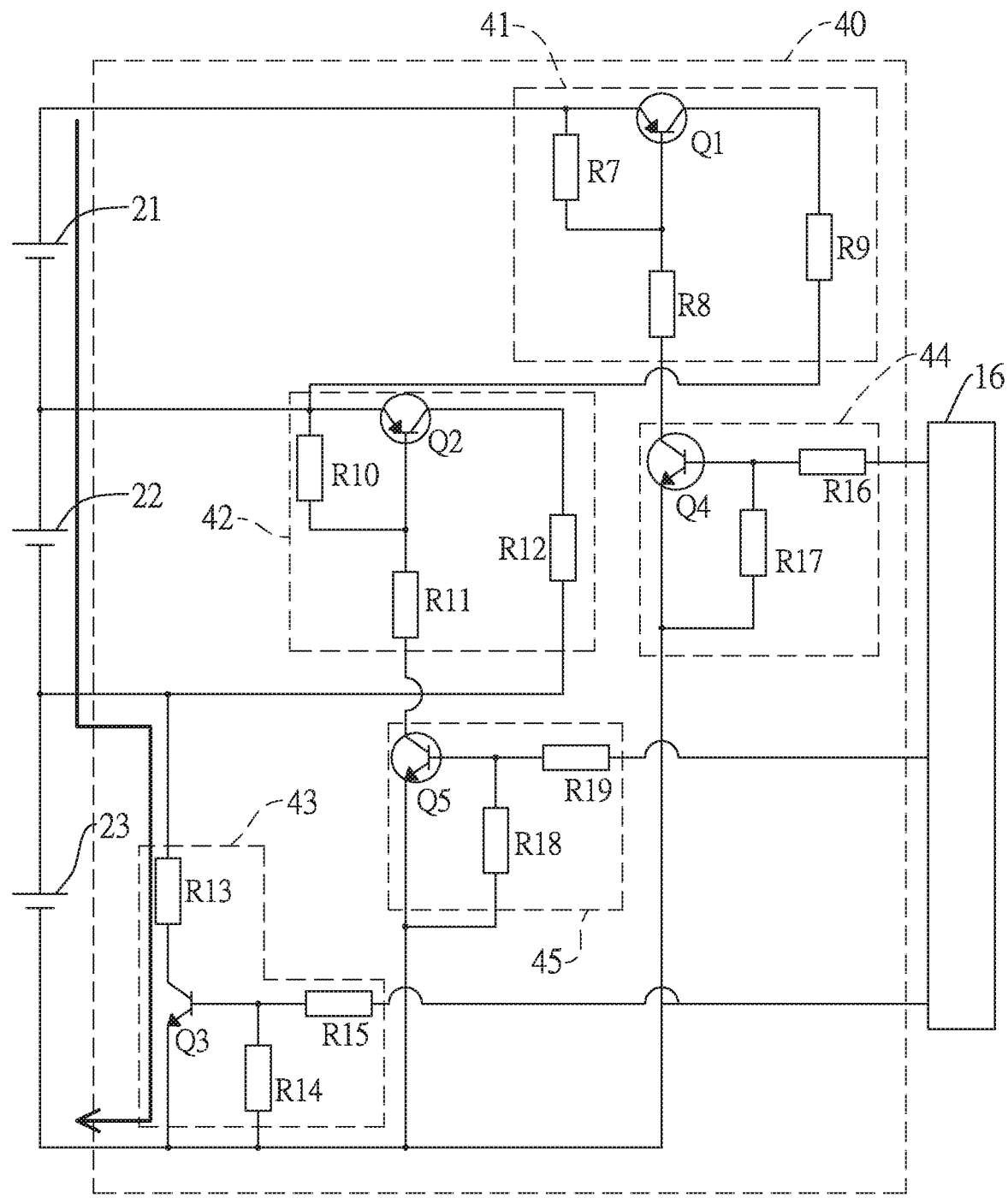
FIG. 5 is a circuit diagram of a voltage control module in the UPSs in FIGS. 1 and 7 showing a third current flowing path under operation.

With reference to FIG. 5, when adjusting charging to the third battery 23 to balance voltages of the first battery 21, the second battery 22 and the third battery 23, the first processor 16 sends a corresponding control signal to turn on the third transistor Q3 of the third transistor switching unit 43, such that after current flows through and charges the first battery 21 and the second battery 22, a minor part of the current charges the third battery 23 and a major part of the current flows through the thirteen resistor R13 and the third transistor Q3.

When a voltage-balancing state of the battery pack is acquired, the first voltage value of the first battery 21, the second voltage value of the second battery 22 and the third voltage value of the third battery 23 are transmitted to the first processor 16 for processing. In the present embodiment, there are three approaches available for processing of the voltage values. The first approach is to divide a difference between a highest voltage value and a lowest voltage value by the rated voltage reference value in generation of a voltage index value. For example, when the first voltage value is the highest voltage value and the third voltage value is the lowest voltage value, the voltage index value can be generated by dividing the difference between the first voltage value and the third voltage value by the rated voltage reference value. The first processor 16 determines a corresponding index range in which the voltage index value falls according to a set of index ranges for generation of battery state information. In the first approach the set of index ranges includes a first index range indicative of the voltage index value less than 0.5% (voltage index value <0.5%), a second index range indicative of the voltage index value greater than or equal to 0.5% and less than 1% (0.5%≤voltage index value <1%), a third index range indicative of the voltage index value greater than or equal to 1% and less than 2% (1% voltage index value <2%), a fourth index range indicative of the voltage index value greater than or equal to 2% and less than 4% (2%≤voltage index value <4%), and a fifth index range indicative of the voltage index value greater than or equal to 4% (voltage index value 4%).

The second approach is to divide the lowest voltage value by the highest voltage value. For example, when the first voltage value is the lowest voltage value and the third voltage value is the highest voltage value, the first voltage value is divided by the third voltage value to generate the voltage index value. The first processor 16 determines a corresponding index range in which the voltage index value falls according to a set of index ranges for generation of battery state information. In the second approach the set of index ranges includes a first index range indicative of the voltage index value greater than 0.995 (voltage index value >0.995), a second index range indicative of the voltage index value greater than 0.99 and less than or equal to 0.995 (0.99<voltage index value ≤0.995), a third index range indicative of the voltage index value greater than 0.98 and less than or equal to 0.99 (0.98<voltage index value ≤0.99), a fourth index range indicative of the voltage index value greater than 0.96 and less than or equal to 0.98 (0.96<voltage index value ≤0.98), and a fifth index range indicative of the voltage index value less than or equal to 0.96 (voltage index value ≤0.96).

The third approach is to obtain a voltage average value by taking an average of the first voltage value, the second voltage value and the third voltage value, take an absolute value between the voltage average value and each of the first voltage value, the second voltage value and the third voltage value in generation of a corresponding computed voltage value, and choose a maximum of the computed voltage values as the voltage index value. The first processor 16 determines a corresponding index range in which the voltage index value falls according to a set of index ranges for generation of battery state information. In the third approach the set of index ranges includes a first index range indicative of the voltage index value less than 25 mV (Millivolt) (voltage index value <25 mV), a second index range indicative of the voltage index value greater than or equal to 25 mV and less than 50 mV (25 mV<voltage index value ≤50 mV), a third index range indicative of the voltage index value greater than or equal to 50 mV and less than 100 mV (50 mV≤voltage index value <100 mV), a fourth index range indicative of the voltage index value greater than or equal to 100 mV and less than 200 mV (100 mV≤voltage index value <200 mV), and a fifth index range indicative of the voltage index value greater than or equal to 200 mV (voltage index value ≥200 mV).

In the present embodiment, it indicates that the voltage-balancing state of the battery pack is excellent, good, usual, not good, or bad when the voltage index value falls in the first index range, the second index range, the third index range, the fourth index range or the fifth index range respectively.

The first processor 16 controls charging to the first battery 21, the second battery 22, and the third battery 23 according to the first to third voltage values for the battery pack to gradually reach the voltage-balancing state as desired. After expiration of a period of time, the first processor 16 acquires an updated voltage-balancing state again. When the voltage-balancing states acquired within a preset state-holding time are identical, the first processor 16 instructs the display unit 17 to display the battery state information associated with the voltage-balancing state of the battery pack for users' awareness. The state-holding time may be at least five days, seven days or ten days and is user-configurable depending on environments where the UPS is operated.

The display unit 17 may be a display that displays the voltage-balancing state of the battery pack by way of text display. When the voltage-balancing state of the battery pack falls in the first index range, the second index range, the third index range, the fourth index range or the fifth index range, the text "Excellent", "Good", "Usual", "Not Good" or "Bad" is displayed on the display for users' awareness.

The display unit 17 may be a display that displays the voltage-balancing state of the battery pack by way of varying background color of the display unit 17. When the voltage-balancing state of the battery pack falls in the first index range, the second index range, the third index range, the fourth index range or the fifth index range, a background color of the display unit 17 is in green, blue, yellow, orange or red for users' awareness.

The display unit 17 may include multiple LEDs (Light-emitting diode) for indication of the voltage-balancing state of the battery pack. When the voltage-balancing state of the battery pack falls in the first index range, the second index range, the third index range, the fourth index range or the fifth index range, a first LED, a second LED, a third LED, a fourth LED or a fifth LED is lit for users' awareness.

Figure 6:
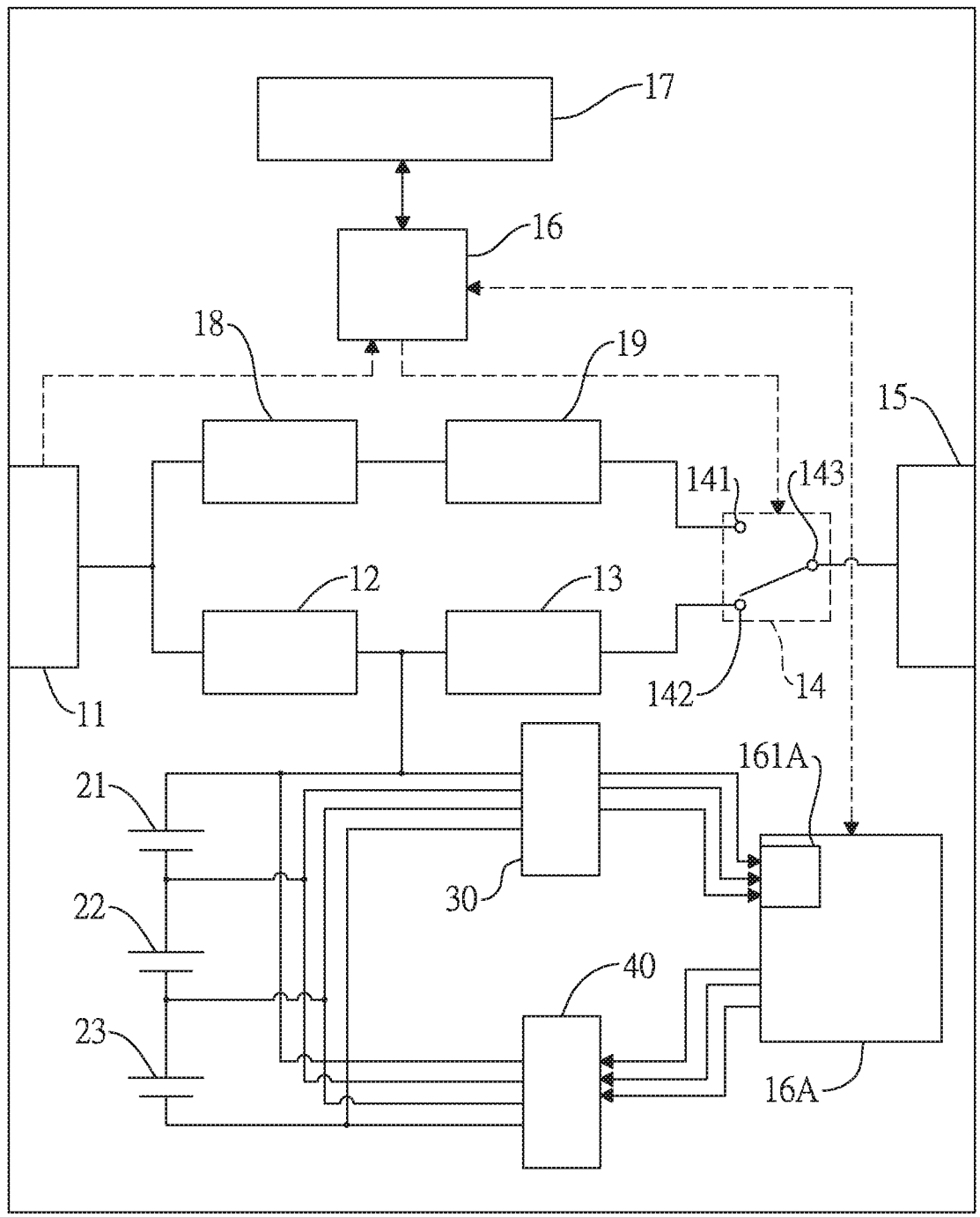
FIG. 6 is a functional block diagram of a second embodiment of a UPS in accordance with the present invention.

With reference to FIG. 6, a second embodiment of a UPS with voltage-balancing state detection of batteries in accordance with the present invention differs from the foregoing embodiment in a second processor 16A connected between the first processor 16 and each of the voltage measurement module 30 and the voltage control module 40. The second processor 16A has a second signal conversion unit 161A and is connected to the first processor 16 to exchange signals. The second processor 16A is connected to the voltage measurement module 30 to receive voltage measured by the voltage measurement module 30, and a voltage value converted by the second signal conversion unit 161A is transmitted to the first processor 16 for processing.

In the present embodiment, as the second processor 16A has the second signal conversion unit 161A, voltage measured by the voltage measurement module 30 is converted by the second signal conversion unit 161A. Under the circumstance, the first processor 16 may not be necessarily equipped with the first signal conversion unit 161. Supposing that sharing the load of the second processor 161A is a concern, the first processor 16 may be equipped with the first signal conversion unit 161 to assist signal conversion.

The second processor 16A processes the received voltage to generate the voltage-balancing state and transmit the voltage-balancing state to the first processor 16 for the first processor 16 to instruct the display unit 17 to display the voltage-balancing state.

In the present embodiment, the second processor 16A can directly send a control signal to the voltage control module 40 to control charging to the battery pack for achieving a desired voltage-balancing state of the battery pack according to the voltages transmitted from the voltage measurement module 30. In view of the second processor 16A located between the first processor 16 and each of the voltage measurement module 30 and the voltage control module 40, large amount of circuits required for the voltage measurement module 30 and the voltage control module 40 to be connected to the first processor 16 can be avoided, and a simplified circuit layout can be achieved.

Figure 7:
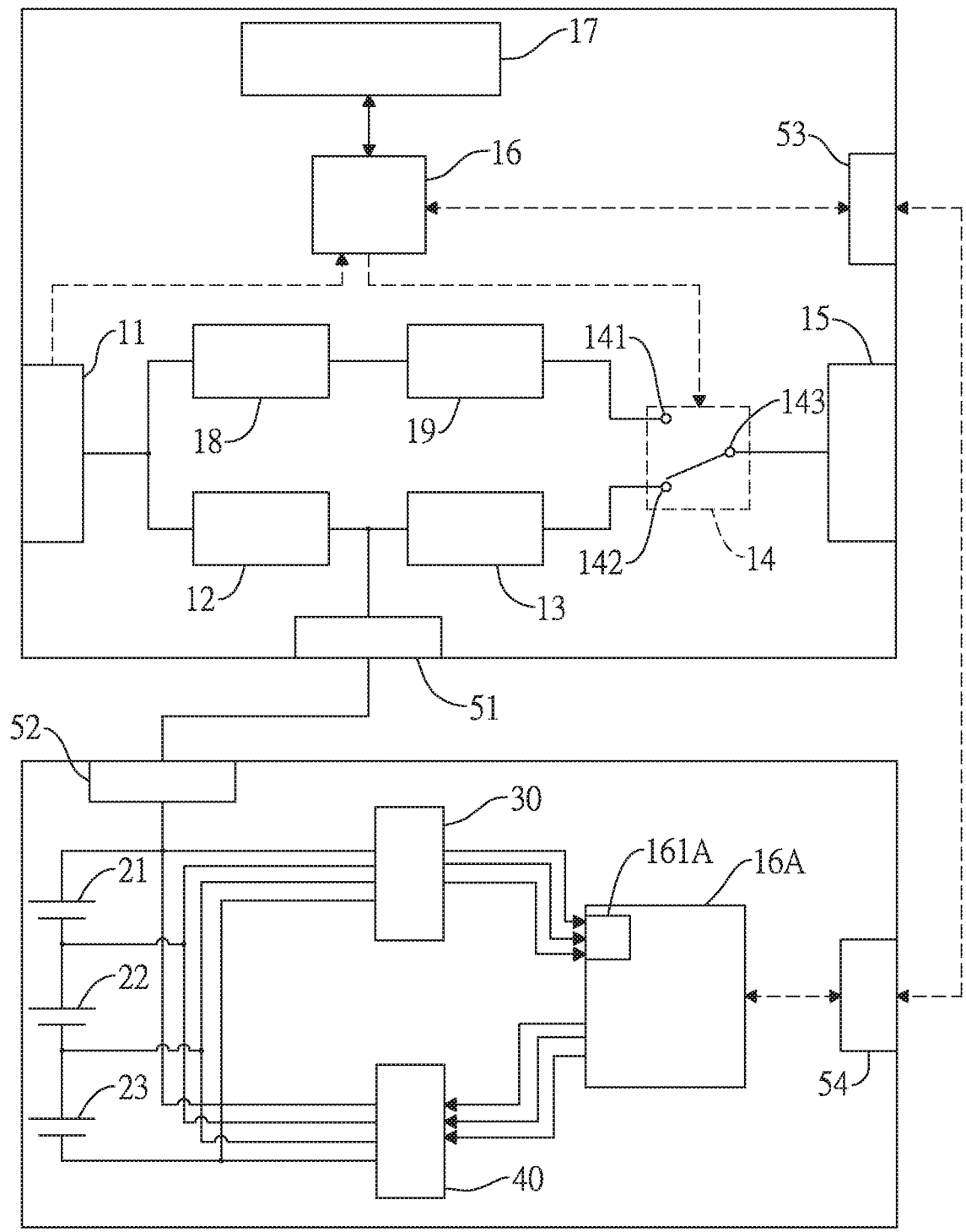
FIG. 7 is a functional block diagram of a third embodiment of a UPS in accordance with the present invention.

With reference to FIG. 7, a third embodiment of a UPS with voltage-balancing state detection of batteries in accordance with the present invention is substantially the same as the second embodiment except that the present embodiment takes the spatial arrangement of the UPS into account. The battery pack, the voltage measurement module 30, the voltage control module 40 and the second processor 16A may be arranged in a different housing. The UPS in the present embodiment further includes a first DC transmission interface port 51, a second DC transmission interface port 52, a first communication interface port 53 and a second communication interface port 54. The first DC transmission interface port 51 is connected to the input terminal of the DC to AC converter 13. The second DC transmission interface port 52 is connected to the positive terminal of the first battery 21 and the voltage measurement module 30. The first DC transmission interface port 51 is connected to the second DC transmission interface port 52. The first communication interface port 53 is connected to the first processor 16. The second communication interface port 54 is connected to the second processor 16A. The first communication interface port 53 is connected to the second communication interface port 54.

When any battery in the battery pack in the UPS in accordance with the present invention is aging, even though charging to the battery pack can be controlled through the voltage control module 40, it is unlikely that the voltage-balancing state of the battery pack can be enhanced. However, detection of the voltage-balancing state of the battery pack allows users to be aware of the voltage-balancing state by prompting through the display unit, thereby ensuring that the battery pack is operated under a reliable manner with a desired voltage-balancing state.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. An un-interruptible power supply (UPS) with voltage-balancing state detection of batteries, comprising:
    an AC (Alternating Current) power input port adapted to receive mains power;
    a battery charging unit connected to the AC power input port;
    a DC (Direct Current) to AC converter connected to the battery charging unit;
    a two-way switch having:
        a first active terminal connected to the AC power input port;
        a second active terminal connected to the DC to AC converter; and
        a common terminal;
        wherein the two-way switch receives a control signal to control the common terminal to switch to connect to one of the first active terminal and the second active terminal;
    an AC power output port connected to the common terminal of the two-way switch and adapted to be connected to an external electronic device to supply an AC power to the external electronic device;
    a first processor connected to the AC power input port to receive an AC power sensing signal, connected to the two-way switch to send the control signal to the two-way switch to switch the common terminal to connect to one of the first active terminal and the second active terminal, and having a signal conversion unit converting received voltage signals into voltage values;
    a display unit connected to the first processor to display information outputted from the first processor;
    a battery pack connected to the battery charging unit and the DC to AC converter, supplying a DC power, and charged by power transmitted from the battery charging unit;
    a voltage measurement module connected to the first processor and the battery pack, measuring voltage signals of the battery pack, and sending the measured voltage signals of the battery pack to the first processor; and
    a voltage control module connected to the first processor, the battery pack and the voltage measurement module;
    wherein the first processor generates a voltage index value according to the voltage values converted from the voltage signals transmitted from the voltage measurement module, determines in which index range that the voltage index value fall into in a set of index ranges and generates battery state information accordingly, controls the voltage control module to charge the battery pack according to the measured voltages, acquires updated battery state information again, and instructs the display unit to display the battery state information of the battery pack when the battery state information and the updated battery state information acquired within a preset state-holding time are identical, and the displayed battery state information is used for indicating a degree of the voltage-balancing of the battery pack.

2. The UPS as claimed in claim 1, wherein the first processor generates the voltage index value by dividing a difference between a maximum and a minimum of the voltage values of the battery pack by a rated voltage reference value.

3. The UPS as claimed in claim 2, wherein the set of index ranges includes a first index range indicative of the voltage index value less than 0.5%, a second index range indicative of the voltage index value greater than or equal to 0.5% and less than 1%, a third index range indicative of the voltage index value greater than or equal to 1% and less than 2%, a fourth index range indicative of the voltage index value greater than or equal to 2% and less than 4%, and a fifth index range indicative of the voltage index value greater than or equal to 4%, and the first processor determines a corresponding index range in which the voltage index value falls for generation of the battery state information.

4. The UPS as claimed in claim 3, wherein the display unit is a display that displays the voltage-balancing state of the battery pack by way of text display.

5. The UPS as claimed in claim 3, wherein the display unit is a display that displays the voltage-balancing state of the battery pack by way of varying a background color of the display.

6. The UPS as claimed in claim 3, wherein the display unit has multiple light-emitting diodes (LEDs), and each LED is lit to indicate a corresponding voltage-balancing state of the battery pack.

7. The UPS as claimed in claim 3, further comprising a second processor, wherein the second processor is connected between the voltage measurement module and the first processor and is connected between the voltage control module and the first processor, receives the voltage signals transmitted from the voltage measurement module, and has a second signal conversion unit converting the voltage signals into the voltage values for the second processor to transmit the voltage values to the first processor.

8. The UPS as claimed in claim 7, further comprising:
a first DC transmission interface port connected to the DC to AC converter;
a second DC transmission interface port connected to the battery pack, the voltage measurement module and the first DC transmission interface port;
a first communication interface port connected to the first processor; and
a second communication interface port connected to the second processor and the first communication interface port.

9. The UPS as claimed in claim 1, wherein the first processor generates the voltage index value by dividing a minimum of the voltage values by a maximum of the voltage values.

10. The UPS as claimed in claim 9, wherein the set of index ranges includes a first index range indicative of the voltage index value greater than 0.995, a second index range indicative of the voltage index value greater than 0.99 and less than or equal to 0.995, a third index range indicative of the voltage index value greater than 0.98 and less than or equal to 0.99, a fourth index range indicative of the voltage index value greater than 0.96 and less than or equal to 0.98, and a fifth index range indicative of the voltage index value less than or equal to 0.96, and the first processor determines a corresponding index range in which the voltage index value falls for generation of the battery state information.

11. The UPS as claimed in claim 10, wherein the display unit is a display that displays the voltage-balancing state of the battery pack by way of text display.

12. The UPS as claimed in claim 10, wherein the display unit is a display that displays the voltage-balancing state of the battery pack by way of varying a background color of the display.

13. The UPS as claimed in claim 10, wherein the display unit has multiple light-emitting diodes (LEDs), and each LED is lit to indicate a corresponding voltage-balancing state of the battery pack.

14. The UPS as claimed in claim 10, further comprising a second processor, wherein the second processor is connected between the voltage measurement module and the first processor and is connected between the voltage control module and the first processor, receives the voltage signals transmitted from the voltage measurement module, and has a second signal conversion unit converting the voltage signals into the voltage values for the second processor to transmit the voltage values to the first processor.

15. The UPS as claimed in claim 14, further comprising:
a first DC transmission interface port connected to the DC to AC converter;
a second DC transmission interface port connected to the battery pack, the voltage measurement module and the first DC transmission interface port;
a first communication interface port connected to the first processor; and
a second communication interface port connected to the second processor and the first communication interface port.

16. The UPS as claimed in claim 1, wherein the first processor obtains a voltage average value by taking an average of the voltage values, takes an absolute value between the voltage average value and each of the voltage values to generate a corresponding computed voltage value, and chooses a maximum of the computed voltage values as the voltage index value, and the first processor determines a corresponding index range in which the voltage index value falls for generation of the battery state information.

17. The UPS as claimed in claim 16, wherein the set of index ranges includes a first index range indicative of the voltage index value less than 25 mV (Millivolt), a second index range indicative of the voltage index value greater than or equal to 25 mV and less than 50 mV, a third index range indicative of the voltage index value greater than or equal to 50 mV and less than 100 mV, a fourth index range indicative of the voltage index value greater than or equal to 100 mV and less than 200 mV, and a fifth index range indicative of the voltage index value greater than or equal to 200 mV, and the first processor determines a corresponding index range in which the voltage index value falls for generation of the battery state information.

18. The UPS as claimed in claim 17, wherein the display unit is a display that displays the voltage-balancing state of the battery pack by way of text display.

19. The UPS as claimed in claim 17, wherein the display unit is a display that displays the voltage-balancing state of the battery pack by way of varying a background color of the display.

20. The UPS as claimed in claim 17, wherein the display unit has multiple light-emitting diodes (LEDs), and each LED is lit to indicate a corresponding voltage-balancing state of the battery pack.

21. The UPS as claimed in claim 17, further comprising a second processor, wherein the second processor is connected between the voltage measurement module and the first processor and is connected between the voltage control module and the first processor, receives the voltage signals transmitted from the voltage measurement module, and has a second signal conversion unit converting the voltage signals into the voltage values for the second processor to transmit the voltage values to the first processor.

22. The UPS as claimed in claim 21, further comprising:
a first DC transmission interface port connected to the DC to AC converter;
a second DC transmission interface port connected to the battery pack, the voltage measurement module and the first DC transmission interface port;
a first communication interface port connected to the first processor; and
a second communication interface port connected to the second processor and the first communication interface port.

* * * * *